(12) United States Patent
Colvin et al.

(10) Patent No.: US 9,805,912 B2
(45) Date of Patent: *Oct. 31, 2017

(54) HYDROGEN COGAS FOR CARBON IMPLANT

(75) Inventors: Neil K. Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1232 days.

This patent is subject to a terminal disclaimer.

(21) Appl. No.: 12/948,369

(22) Filed: Nov. 17, 2010

(65) Prior Publication Data

US 2012/0118232 A1    May 17, 2012

(51) Int. Cl.
| | | |
|---|---|---|
| *H01J 37/317* | (2006.01) | |
| *H01J 47/08* | (2006.01) | |
| *H01J 27/02* | (2006.01) | |
| *H01J 37/08* | (2006.01) | |

(52) U.S. Cl.
CPC ........ *H01J 37/3171* (2013.01); *H01J 27/022* (2013.01); *H01J 37/08* (2013.01); *H01J 2237/006* (2013.01); *H01J 2237/08* (2013.01)

(58) Field of Classification Search
CPC ...... H01J 37/3174; H01J 37/08; H01J 27/022; H01J 2237/996; H01J 2237/09
USPC .................................................... 250/492.21
See application file for complete search history.

(56) References Cited

U.S. PATENT DOCUMENTS

| | | |
|---|---|---|
| 6,135,128 A | 10/2000 | Graf et al. |
| 6,215,245 B1 | 4/2001 | Mori |
| 7,301,160 B2 | 11/2007 | Banks |
| 7,446,326 B2 | 11/2008 | Chaney et al. |
| 7,511,287 B2 | 3/2009 | Reece et al. |
| 7,531,819 B2 | 5/2009 | DiVergilio et al. |
| 7,586,109 B2 | 9/2009 | Perel et al. |
| 2003/0234371 A1 | 12/2003 | Ziegler |
| 2009/0081874 A1 | 3/2009 | Cook et al. |
| 2011/0259366 A1 | 10/2011 | Sweeney et al. |
| 2012/0252195 A1* | 10/2012 | Jones et al. ............... 438/514 |
| 2013/0140473 A1 | 6/2013 | Colvin et al. |

OTHER PUBLICATIONS

Rosenthal et al., Why does combining hydrogen and oxygen typicaly produce water rather than hydrogen peroxide?' Oct. 30, 2006, Scientific American, http://www.scientificamerican.com/article/why-does-combining-hydrog/.*
Non-Final Office Action dated Mar. 15, 2012 to U.S. Appl. No. 12/948,309.
Office Action dated Mar. 11, 2013 for U.S. Appl. No. 12/948,309.
Final Office Action dated Jul. 17, 2013 for U.S. Appl. No. 12/948,309.
Office Action dated May 26, 2017 for U.S. Appl. No. 12/948,309.

* cited by examiner

*Primary Examiner* — Wyatt Stoffa
*Assistant Examiner* — Eliza Osenbaugh-Stewart
(74) *Attorney, Agent, or Firm* — Eschweiler & Potashnik, LLC

(57) ABSTRACT

A system, apparatus and method for increasing ion source lifetime in an ion implanter are provided. Oxidation of the ion source and ion source chamber poisoning resulting from a carbon and oxygen-containing source gas is controlled by utilizing a hydrogen co-gas, which reacts with free oxygen atoms to form hydroxide and water.

19 Claims, 7 Drawing Sheets

HYDROGEN COGAS FOR CARBON IMPLANT

FIELD OF INVENTION

The present invention relates generally to semiconductor device fabrication and ion implantation, and more particularly to a method of improving performance and extending the lifetime of an ion source in an ion implanter.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

Referring to FIG. 1, the system 100 includes an ion source 102 for producing an ion beam along a beam path. A beamline assembly 110 is provided downstream of the ion source 102 to receive a beam therefrom. The beamline system 110 may include (not shown) a mass analyzer, an acceleration structure, which may include, for example, one or more gaps, and an angular energy filter. The beamline assembly 110 is situated along the path to receive the beam. The mass analyzer includes a field generating component, such as a magnet, and operates to provide a field across the beam path so as to deflect ions from the ion beam at varying trajectories according to mass (e.g., charge to mass ratio). Ions traveling through the magnetic field experience a force which directs individual ions of a desired mass along the beam path and which deflects ions of undesired mass away from the beam path.

A process chamber 112 is provided in the system 100, which contains a target location that receives the ion beam from the beam line assembly and supports one or more workpieces 114 such as semiconductor wafers along the path for implantation using the final mass analyzed ion beam. The process chamber 112 then receives the ion beam which is directed toward a workpiece 114. It is appreciated that different types of process chambers 112 may be employed in the system 100. For example, a "batch" type process chamber 112 can simultaneously support multiple workpieces 114 on a rotating support structure, wherein the workpieces 114 are rotated through the path of the ion beam until all the workpieces 114 are completely implanted. A "serial" type plasma chamber 114, on the other hand, supports a single workpiece 114 along the beam path for implantation, wherein multiple workpieces 114 are implanted one at a time in serial fashion, with each workpiece 114 being completely implanted before implantation of the next workpiece 114 begins. The process chamber 112 may also include a scanning apparatus for moving the beam with respect to the workpiece, or the workpiece with respect to the beam.

Ion sources in ion implanters typically generate an ion beam by ionizing within a source chamber a source gas, a component of which can be a desired dopant element, and extracting the ionized source gas in the form of an ion beam. The ionization process is effected by an exciter which may take the form of a thermally heated filament, a filament heating a cathode (indirectly heated cathode "IHC"), or a radio frequency (RF) antenna.

Examples of desired dopant elements of which the source gas is comprised can include carbon, oxygen, boron, germanium, silicon, amongst others. Of increasing interest is the use of carbon, which can be utilized in many implant steps, for example, material modification. The most common precursor source gases for carbon implants include carbon dioxide and carbon monoxide.

In constructing the ion source chamber illustrated in FIG. 1, refractory metals such as tungsten and molybdenum are commonly used to form the cathode electrodes and interior wall surfaces of the chamber 102. During generation of the carbon ion utilizing a carbon dioxide or carbon monoxide source gas, free oxygen atoms are generated in the ion chamber, and react with the material from which the electrodes, the chamber liners, chamber body and arc slit are constructed. The chamber 102 will react with the free oxygen ions to form tungsten and molybdenum oxides, which build up on these surfaces and detrimentally affect the efficiency of the ion source and poison the chamber 102.

In order to combat such effects, it has been known to run a co-gas with the carbon dioxide source gas to relieve the destructive tendencies of the free oxygen. Co-gases used for this purpose include, amongst others, phosphine ($PH_3$). A co-gas such as phosphine, however, adds gas flow and pressure to the ion source without adding any usable precursor material, as well as being more expensive and toxic than other alternatives.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the invention facilitate ion implantation processes by removing oxygen atoms generated from the disassociation and ionization of carbon-containing source gases which can oxidize (poison) the ion source, thereby reducing electron emission from the cathode. Beam current, as well as lifetime of the ion source are thereby increased. Associated apparatus and an ion implantation system for carrying out the method are disclosed herein.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
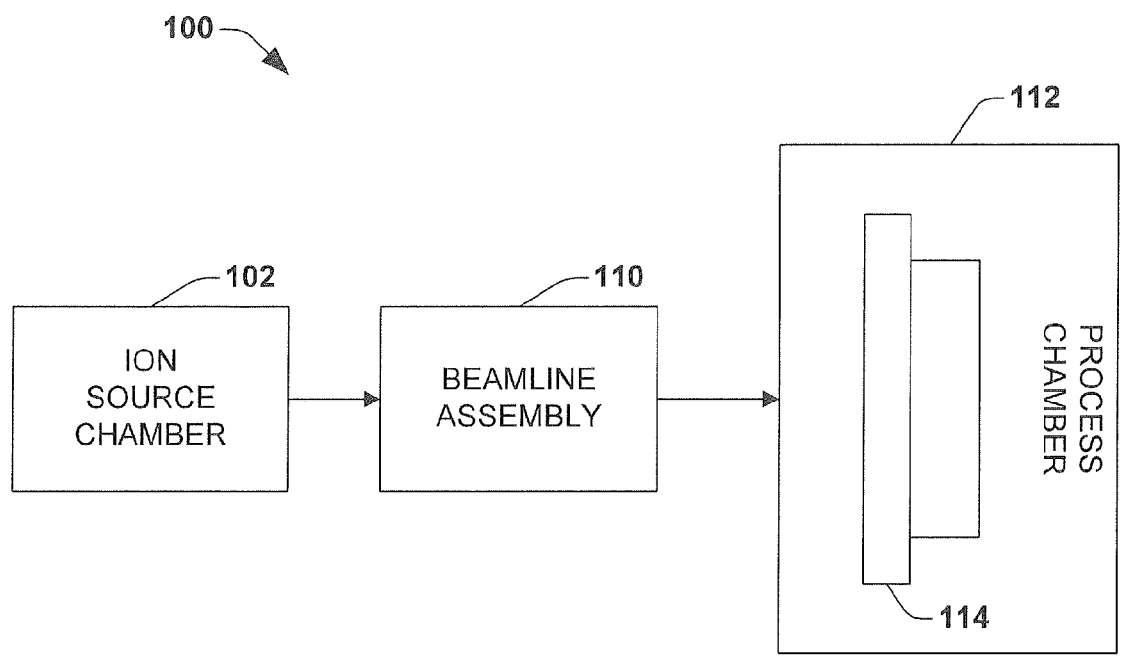
FIG. 1 is an ion implantation system suitable for implementing one or more aspects of the present invention in block diagram form.

The invention will now be described with reference to the attached drawings, wherein like reference numerals are used to refer to like elements throughout. It will be appreciated by those skilled in the art that the invention is not limited to the exemplary implementations and aspects illustrated and described hereinafter.

Figure 2A:
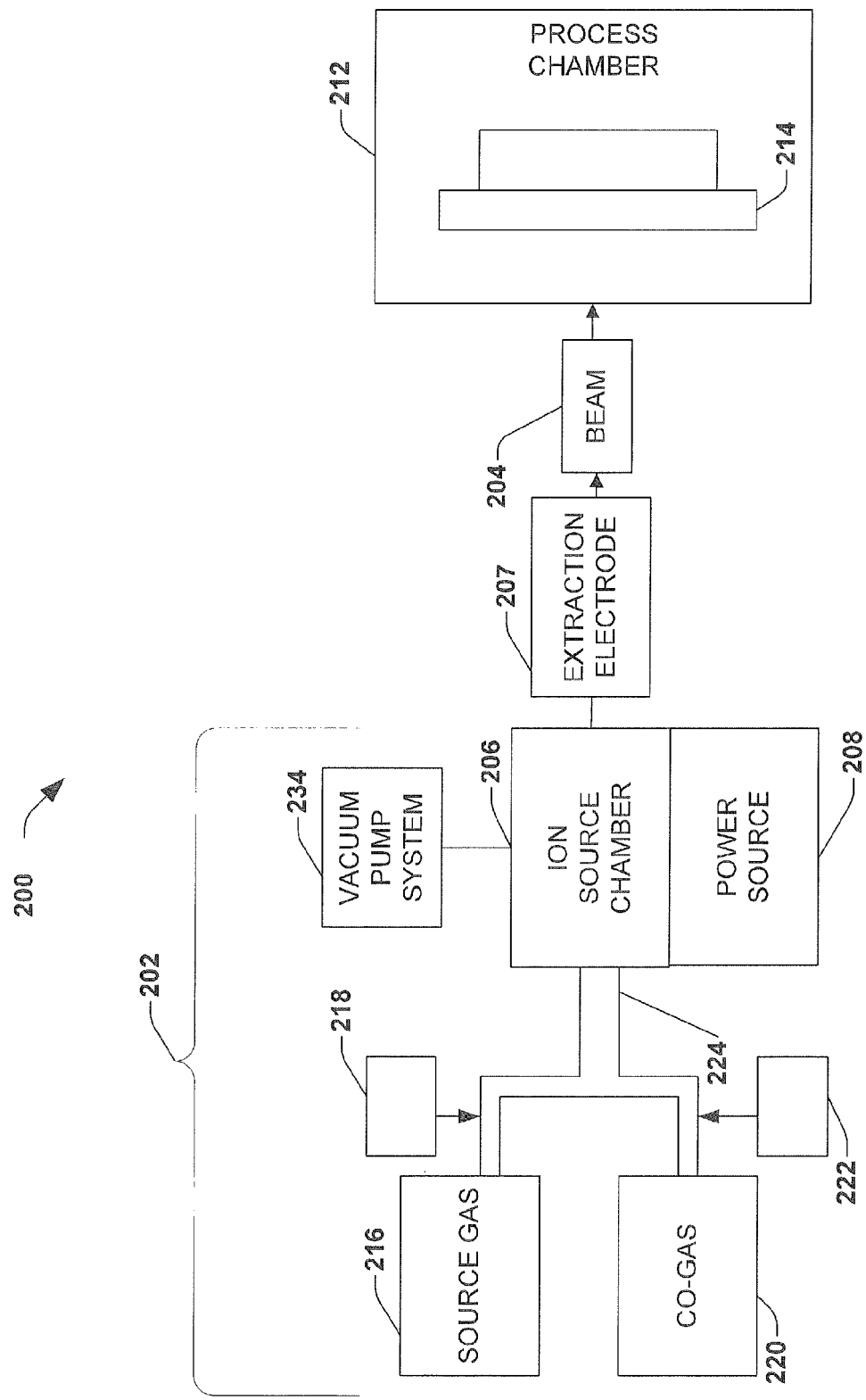
FIG. 2A is an ion implantation system illustrating one embodiment of an ion source assembly in accordance with an aspect of the invention.

Referring initially to FIG. 2, an ion implantation system 200 suitable for implementing one or more aspects of the invention is depicted in block diagram form.

The system 200 includes an ion source assembly 202 for producing an ion beam 204 along a beam path. The ion beam assembly 202 includes, for example, an ion source chamber 206 with an associated power source 208. The ion source chamber 206 may, for example, comprise a relatively long plasma confinement chamber from which an ion beam is extracted and accelerated. An extraction electrode 207 is positioned for extraction of an ion beam from the ion source chamber 206.

A source gas supply 216 containing a carbon-containing source gas is coupled to the ion source chamber 206 via common inlet 224. The source gas supply may comprise a carbon-containing source gas, for example, carbon dioxide or carbon monoxide. Gas flow regulator 218 controls the amount and rate of source gas 216 to ion source chamber 206. A co-gas supply 220 containing a hydrogen co-gas is coupled to ion source chamber 206 via common inlet 224. Gas flow regulator 222 controls the amount and rate of co-gas to be supplied to ion source chamber 206.

During operation of the ion source chamber 206, the carbon-containing source gas 216 and hydrogen co-gas 220 are introduced into ion source chamber 206 through inlet 224. Carbon-containing source gas 216 is dissociated and/or ionized to form a plasma of charged particles containing carbon ions and oxygen ions. Free oxygen ions react with hydrogen co-gas 220 to form water molecules and hydroxides which are removed from the chamber 206 by a vacuum pump system 234.

Figure 2B:
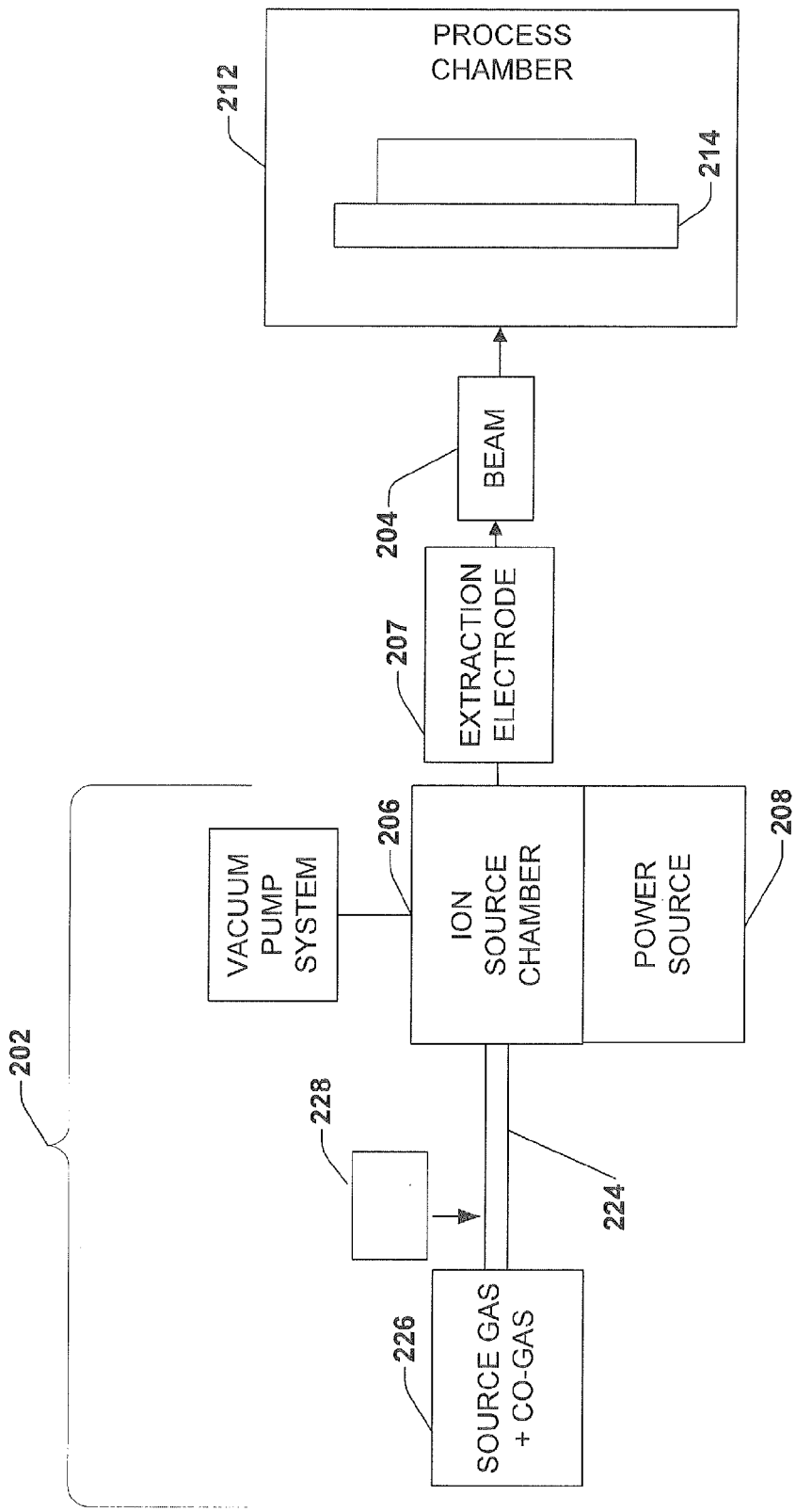
FIG. 2B is an ion implantation system illustrating an alternative embodiment of an ion source assembly in accordance with an aspect of the invention.
Figure 2C:
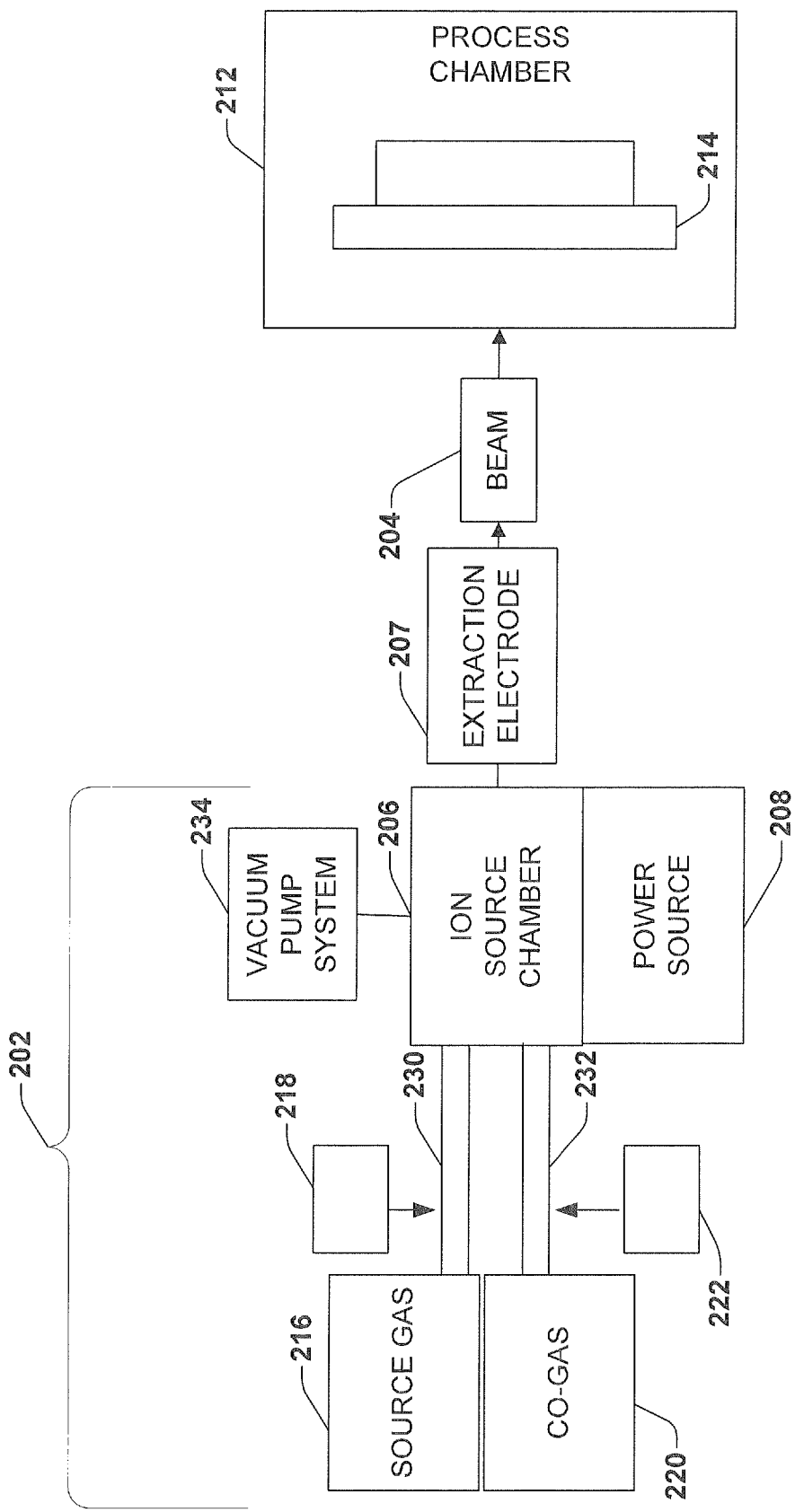
FIG. 2C is an ion implantation system illustrating a further embodiment of an ion source assembly in accordance with an aspect of the invention.

FIGS. 2B-2C illustrate alternative embodiments of the invention. Where the source gas 216 and co-gas 220 were obtained from separate supplies and mixed in inlet 224 prior to entry into the ion source chamber 206 in the previous embodiment, it is also contemplated that the source gas 216 and co-gas 220 may be obtained as a pre-mixed product and supplied to the ion source chamber 206 in one product, as illustrated in FIG. 2B. Here, a mixture 226 of source gas and co-gas are supplied in a single source with an associated gas flow meter 228 which controls the rate and flow of mixture 226 into the ion source chamber 206. Single source 226 enters ion source chamber 206 through inlet 224.

During operation of the ion source chamber 206, the carbon-containing source gas and co-gas mixture 226 are released into the ion source chamber 206 through inlet 224. The carbon-containing source gas is dissociated and/or ionized to form a plasma of charged particles containing carbon ions and oxygen ions. Free oxygen ions react with hydrogen ions from the co-gas to form water molecules and hydroxide which are removed from the chamber 206 by vacuum pump system 234.

FIG. 2C illustrates a further embodiment in which two separate inlets 230, 232 are provided, one for source gas 216 and one for co-gas 220. The gases 216, 220 are then mixed in the ion source chamber 206. Gas flow meter 218 for source gas 216 and gas flow meter 224 for co-gas 220 control flow of the gases through inlets 230 and 232, respectively, for entry into ion source chamber 206.

Figure 3:
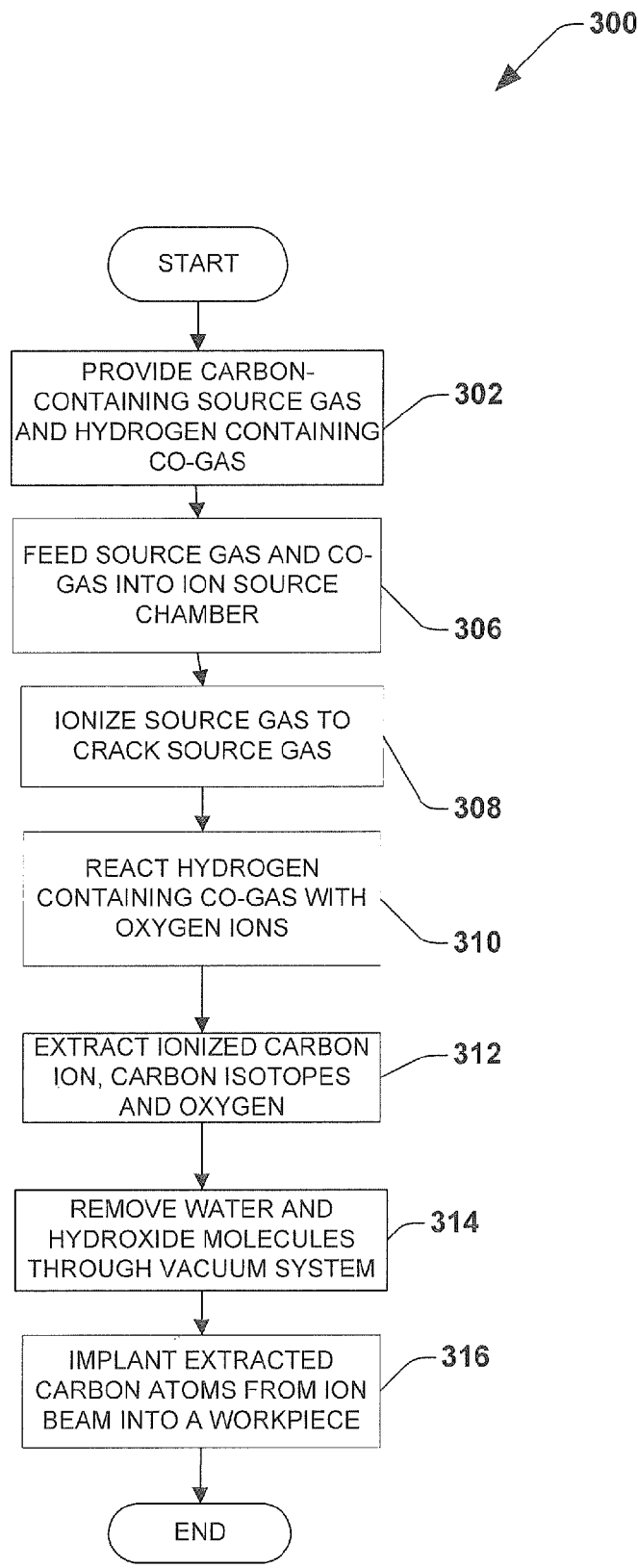
FIG. 3 is a flow diagram illustrating a method of in accordance with an aspect of the invention.

FIG. 3 is a flow diagram illustrating a method 300 for improving performance and extending lifetime of an ion source utilizing a carbon-containing source gas in an ion implanter in accordance with an aspect of the invention. The method 300 employs a hydrogen co-gas during operation of the ion implantation system in order to facilitate removal of free oxygen ions generated when a carbon-containing source gas is utilized. The above figures and description can also be referenced with this method 300 for further description.

The method 300 begins at block 302 wherein a carbon-containing source gas and a hydrogen co-gas are supplied. The method continues at 306 where the source gas and co-gas are fed into an ion source chamber where electrons emitted by a cathode are accelerated and ionize the gas molecules of the source gas at 308 within the ion source chamber to crack the source gas and created the desired ion. At 310, the hydrogen co-gas is reacted with free oxygen ions to form water or hydroxide. Ionized carbon ions, carbon isotopes, and oxygen are extracted at 312. Water and hydroxide molecules are then removed by a vacuum pump system at 314. At 316, the extracted carbon ions are implanted from an ion beam into a workpiece.

Figure 4:
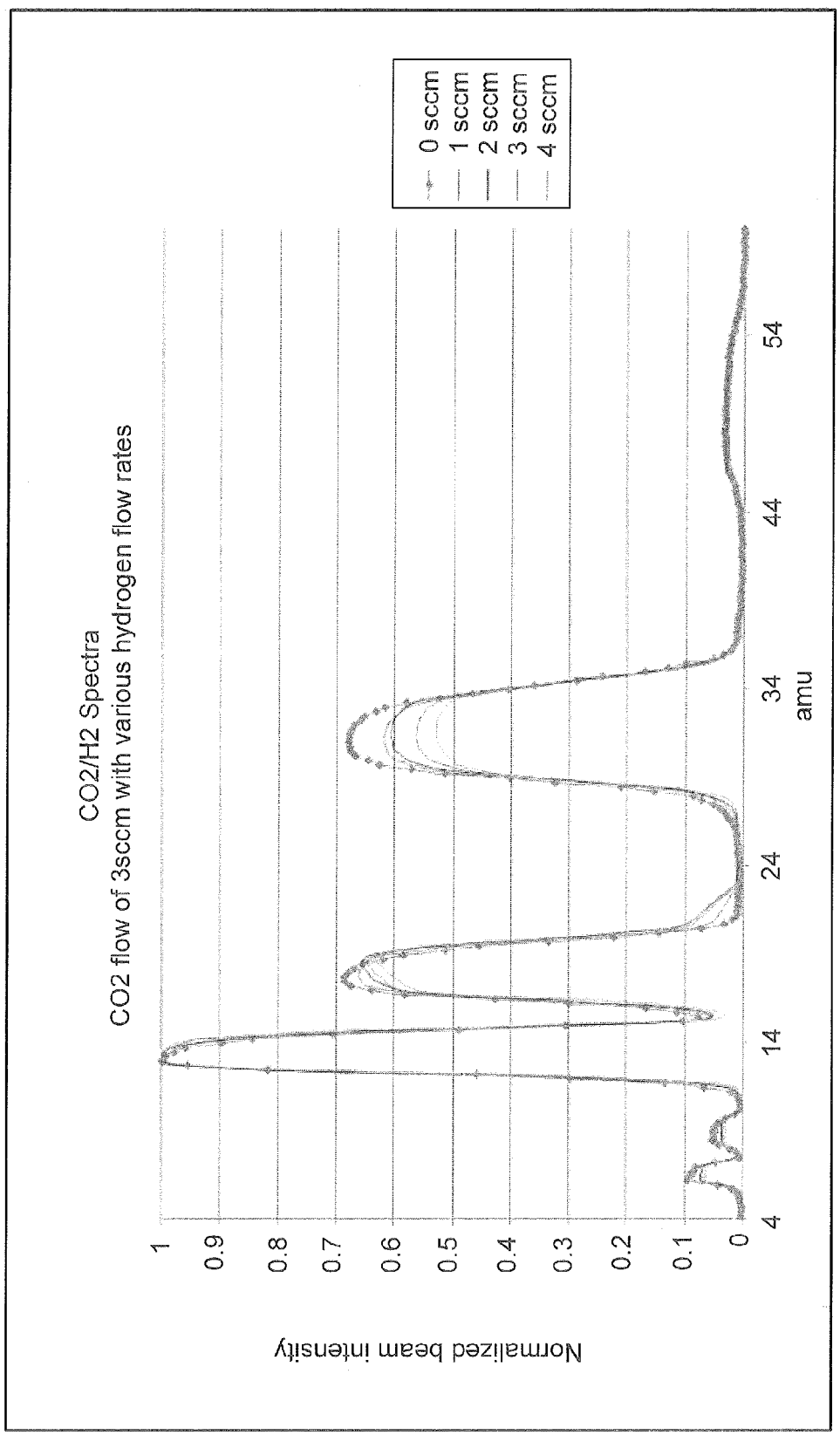
FIG. 4 is a graphical representation illustrating a mass spectra of carbon dioxide/hydrogen with various ratios of hydrogen in accordance with an aspect of the invention.

The selected flow rates of the carbon-containing source gas and hydrogen co-gas can vary so that the maximum amount of oxygen ions are removed without deleteriously affecting the beam current. The amount of co-gas supplied can be determined, at least in part, by analysis of the beam composition during operation. In FIG. 4 there is illustrated a graphical representation of the mass spectra of an ion implantation method utilizing carbon dioxide as the source gas, with various ratios of hydrogen gas. In all cases the carbon 12 mass peak has been normalized to the same value. With a fixed flow of 3 sccm for CO2, the $H_2$ flow was varied from 0 sccm to 4 sccm of flow. A mass spectra was taken at each flow level to monitor the key AMU peaks 12 (carbon), 16 (O) and 28 (CO). As the H2 was increased both the AMU peaks 16 and 28 were reduced relative to the carbon peak indicating that oxygen was reacting with the hydrogen co-gas. This was further evidenced by the shifting to the right (to a higher amu) at the peak/maxima of AMU 16. This shoulder is the formation of hydrogen oxide at amu17 (hydride) and the formation of $H_2O$ at AMU 18.

Figure 5:
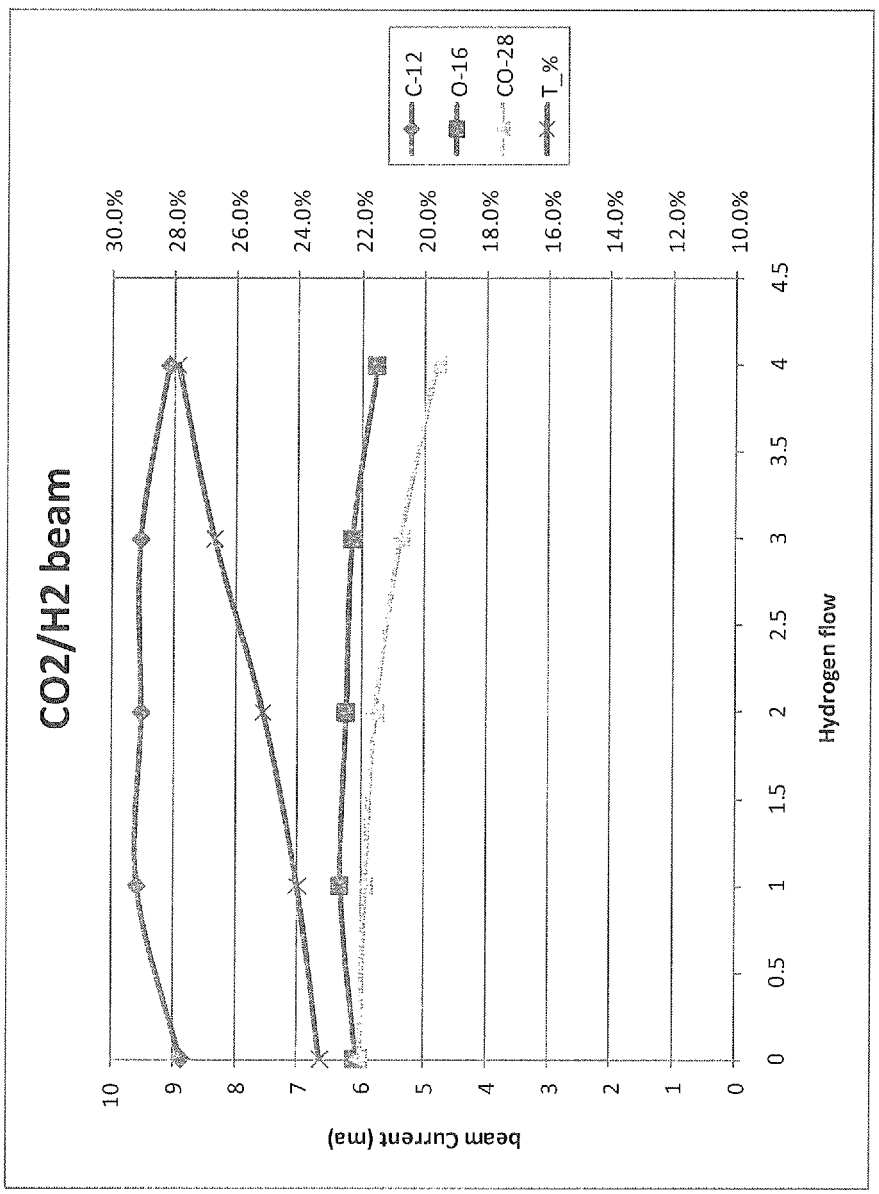
FIG. 5 is a graphical representation illustrating an actual beam current from various ratios of hydrogen co-gas in accordance with an aspect of the invention.

In FIG. 5 there is a graphical representation of the actual beam currents obtained from the various ratios of co-gas, both for carbon 12 and for the other peaks of interest. Also shown in this figure is the transmission for the carbon beam current (defined as beam current divided by the difference of extraction minus suppression currents) as a function of the amount of carbon in the gas mixture by flow. Using beam tuning with no co-gas as a baseline, it is seen that increasing hydrogen flow improves the reducing reactions between hydrogen and oxygen as all other peak (O and CO) intensities are reduced. While the transmission continues to climb with increased hydrogen, the carbon beam current remains almost constant across the different flows of hydrogen until it begins to degrade at 3 sccm indicating the introduction of too much co-gas. In this particular case the optimal ratio appears to be a 3:2 sccm flow setting as the beam current is basically constant between 1 and 3 sccm of H2 flow. This setting minimized the oxidation of the cathode, repeller and other internal chamber components. By reacting out the oxygen with the co-gas the arc chamber life was dramatically increased, with the added benefit of stable beam current throughout the life of the source.

While, for purposes of simplicity of explanation, the method 300 is depicted and described as executing serially, it is to be understood and appreciated that the present invention is not limited by the illustrated order, as some aspects could, in accordance with the invention, occur in different orders and/or concurrently with other aspects from that depicted and described herein. For instance, it is contemplated that the flow of carbon-containing source gas and hydrogen co-gas into the ion source chamber may occur simultaneously. In another embodiment, it is contemplated that the flow of these gases may occur sequentially, such that a carbon-containing source gas is introduced into the ion source chamber, followed by a flow of hydrogen-containing co-gas into the ion source chamber. Moreover, not all illustrated features or blocks may be required to implement a methodology in accordance with an aspect the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. A method of increasing a lifetime of an ion source in an ion implantation system configured to produce an ion beam for implanting carbon ions, the method comprising:
   introducing a gaseous substance into an ion source chamber of the ion implantation system at a first flow rate, the gaseous substance including a carbon-containing species;
   introducing an amount of a hydrogen co-gas into the ion source chamber of the ion implantation system at a second flow rate;
   exciting the carbon-containing gaseous species within the ion source chamber to create a plasma of disassociated and ionized carbon and oxygen constituents;
   reacting the disassociated and ionized oxygen constituents of the carbon-containing gaseous species with the hydrogen co-gas, wherein the hydrogen co-gas reacts with oxygen to produce water or hydroxide, therein reducing poisoning of the ion source chamber and increasing ion source lifetime; and
   removing the water or hydroxide from the ion source chamber by a vacuum pump system, wherein the first flow rate and the second flow rate are selectively varied so that a maximum amount of oxygen constituents are removed without deleteriously affecting a current of the ion beam.

2. The method of claim 1, the gaseous substance including a carbon-containing species comprising carbon dioxide or carbon monoxide.

3. The method of claim 1, wherein the hydrogen co-gas reacts with oxygen to produce water or hydroxide.

4. The method of claim 1, wherein the gaseous substance and the co-gas are introduced simultaneously into the ion source chamber.

5. The method of claim 1, wherein the carbon-containing source gas and the co-gas are introduced sequentially into the ion source chamber.

6. The method of claim 1, wherein the gaseous substance and the co-gas are pre-mixed prior to introduction into the ion source chamber.

7. The method of claim 1, further comprising:
   analyzing a composition of the ion beam during an operation of the ion implantation system; and
   determining the amount of the hydrogen co-gas that is introduced into the ion source chamber relative to the gaseous substance based on the analysis of the composition of the ion beam.

8. The method of claim 7, wherein analyzing the composition of the ion beam comprises performing a mass spectra analysis of the ion beam.

9. A method of increasing a lifetime of an ion source in an ion implantation system configured to produce an ion beam for implanting carbon ions, the method comprising:
   introducing a source gas into an ion source chamber of the ion implantation system at a first flow rate, wherein the source gas contains carbon and oxygen;
   introducing an amount of a hydrogen co-gas into the ion source chamber at a second flow rate;
   exciting the source gas within the ion source chamber to create a plasma of disassociated and ionized carbon and oxygen constituents;
   reacting the disassociated and ionized oxygen constituents of the source gas with the hydrogen co-gas to produce one or more of water or hydroxide, therein reducing poisoning of the ion source chamber and increasing ion source lifetime;
   removing the water or hydroxide from the ion source chamber by a vacuum pump system; and
   selectively varying the first flow rate and the second flow rate, whereby an amount of the disassociated and ionized oxygen constituents is maximized and removed by the vacuum pump system while maintaining a constant current of the ion beam.

10. The method of claim 9, further comprising:

analyzing a composition of the ion beam during an operation of the ion implantation system; and determining the amount of the hydrogen co-gas that is introduced into the ion source chamber relative to the source gas based on the analysis of the composition of the ion beam.

11. The method of claim 10, wherein performing the analysis of the composition of the ion beam comprises performing a mass spectra analysis of the ion beam.

12. The method of claim 9, wherein the source gas comprises carbon dioxide.

13. The method of claim 9, wherein the source gas comprises carbon monoxide.

14. The method of claim 9, wherein the hydrogen co-gas reacts with the disassociated and ionized oxygen constituents to produce water and hydroxide.

15. The method of claim 9, wherein the source gas and the hydrogen co-gas are introduced simultaneously into the ion source chamber.

16. The method of claim 9, wherein the source gas and the hydrogen co-gas are introduced sequentially into the ion source chamber.

17. The method of claim 9, wherein the source gas and the hydrogen co-gas are pre-mixed prior to introduction into the ion source chamber.

18. A method of increasing a lifetime of an ion source in an ion implantation system, the method comprising:

introducing a source gas into an ion source chamber of the ion implantation system at a first flow rate, wherein the source gas contains carbon and oxygen;

introducing an amount of a hydrogen co-gas into the ion source chamber at a second flow rate;

exciting the source gas within the ion source chamber to create a plasma of disassociated and ionized carbon and oxygen constituents;

forming an ion beam containing carbon ions from the plasma of disassociated and ionized carbon and oxygen constituents;

analyzing a composition of the ion beam during an operation of the ion implantation system;

determining the amount of the hydrogen co-gas that is introduced into the ion source chamber relative to the source gas based on the analysis of the composition of the ion beam;

reacting the disassociated and ionized oxygen constituents of the source gas with the hydrogen co-gas to produce one or more of water or hydroxide, therein reducing poisoning of the ion source chamber and increasing ion source lifetime;

removing the water or hydroxide from the ion source chamber by a vacuum pump system; and selectively varying the first flow rate and the second flow rate, whereby an amount of the disassociated and ionized oxygen constituents is maximized and removed by the vacuum pump system while maintaining a constant current of the ion beam.

19. The method of claim 18, wherein performing the analysis of the composition of the ion beam comprises performing a mass spectra analysis of the ion beam.

* * * * *